US011988710B2

(12) United States Patent
Hsu

(10) Patent No.: US 11,988,710 B2
(45) Date of Patent: May 21, 2024

(54) TEST METHODS, TESTER, LOAD BOARD AND TEST SYSTEM

(71) Applicant: Changxin Memory Technologies, Inc., Anhui (CN)

(72) Inventor: Chia-Chi Hsu, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 585 days.

(21) Appl. No.: 17/166,956

(22) Filed: Feb. 3, 2021

(65) Prior Publication Data

US 2021/0173008 A1 Jun. 10, 2021

Related U.S. Application Data

(63) Continuation of application No. PCT/CN2019/100510, filed on Aug. 14, 2019.

(30) Foreign Application Priority Data

Aug. 31, 2018 (CN) .......................... 201811012537.4
Aug. 31, 2018 (CN) .......................... 201821427929.2

(51) Int. Cl.
*G01R 31/28* (2006.01)
*G01R 23/02* (2006.01)
(Continued)

(52) U.S. Cl.
CPC ...... *G01R 31/31713* (2013.01); *G06F 11/267* (2013.01); *G06F 11/273* (2013.01)

(58) Field of Classification Search
CPC ...... G01R 31/28; G01R 31/31; G01R 31/317; G01R 23/02; G06F 11/26; G06F 11/267; G06F 11/273
See application file for complete search history.

(56) References Cited

U.S. PATENT DOCUMENTS 5,101,153 A 3/1992 Morong, III
6,049,900 A 4/2000 Fournel et al.
(Continued)

FOREIGN PATENT DOCUMENTS

CN 1285073 A 2/2001
CN 1917370 A 2/2007
(Continued)

OTHER PUBLICATIONS

PCT International Preliminary Report on Patentability dated Mar. 11, 2021, issued in related International Application No. PCT/CN2010/100510 (7 pages).
(Continued)

*Primary Examiner* — Neel D Shah
(74) *Attorney, Agent, or Firm* — Sheppard Mullin Richter & Hampton LLP

(57) ABSTRACT

The present invention provides a test method, a tester, a load board and a test system. The test method includes: outputting, through a first input/output (I/O) port of a tester, a first test signal to a first channel of a load board, wherein the first test signal is used to generate a second test signal and a third test signal; receiving, through the first I/O port, a third feedback signal returned from the first channel, wherein the third feedback signal is generated based on a first feedback signal and a second feedback signal; and determining whether a first chip and a second chip are operating normally based on the third feedback signal. Solutions provided in the present invention are capable of increasing the number of chips that can be tested at a single time.

20 Claims, 8 Drawing Sheets

(51) Int. Cl.
  *G01R 31/317* (2006.01)
  *G06F 11/26* (2006.01)
  *G06F 11/267* (2006.01)
  *G06F 11/273* (2006.01)

(56) References Cited

U.S. PATENT DOCUMENTS

| | | | |
|---|---|---|---|
| 6,256,243 | B1 | 7/2001 | Savignac et al. |
| 7,550,999 | B2 | 6/2009 | Gotou |
| 8,005,637 | B2 | 8/2011 | Bengtsson et al. |
| 9,851,400 | B1 | 12/2017 | Longstreet et al. |
| 10,067,171 | B2 | 9/2018 | O'Keeffe et al. |
| 10,613,128 | B2 * | 4/2020 | Yeh ................ G11C 29/56012 |
| 2004/0008024 | A1 | 1/2004 | Miller |
| 2008/0086667 | A1 | 4/2008 | Chen et al. |
| 2009/0102503 | A1 | 4/2009 | Saito |
| 2011/0161753 | A1 | 6/2011 | Park et al. |
| 2015/0221397 | A1 | 8/2015 | Kim |

FOREIGN PATENT DOCUMENTS

| | | | |
|---|---|---|---|
| CN | 101248363 A | | 8/2008 |
| CN | 101535821 A | | 9/2009 |
| CN | 101651474 A | | 2/2010 |
| CN | 101915892 A | | 12/2010 |
| CN | 102307118 A | | 1/2012 |
| CN | 105283770 A | | 1/2016 |
| CN | 105321580 A | | 2/2016 |
| CN | 106164685 A | | 11/2016 |
| CN | 106885995 A | | 6/2017 |
| CN | 108037433 A | | 5/2018 |
| CN | 108732489 A | | 11/2018 |
| CN | 208766274 U | | 4/2019 |
| IN | 105717439 A | | 6/2016 |
| WO | 96/33461 A1 | | 10/1996 |
| WO | 00/45160 A1 | | 8/2000 |

OTHER PUBLICATIONS

First Office and Search Report dated Mar. 30, 2023, issued in related Chinese Application No. 201811012537.4, with English machine translation (22 pages).

John M. Emmert et al., "A Monolithic Spectral BIST Technique for Control or Test of Analog or Mixed-Signal Circuits", Proceedings of the 18th IEEE International Symposium on Defect and Fault Tolerance in VLSI Systems (DFT'03), Dec. 8, 2003.

Yuan-xing Guo et al., "Design of General Test Platform based on AXIE", Communications Technology, vol. 47, No. 2, Feb. 2014, pp. 226-230, with English language abstract.

Rui Huang et al., "Design of Testing Machine for Integrated Circuit Based on PXI", Process and Fabrication, 34(8), Aug. 2017, pp. 67-73, with English language abstract.

Yan Liu et al., "Research and Design of Testing Device for Common Logic Gate Chip", Experimental Technology and Management, vol. 34, No. 1, Jan. 2017, with English language abstract.

PCT International Search Report and the Written Opinion dated Nov. 13, 2019, issued in related International Application No. PCT/CN2019/100510 (9 pages).

* cited by examiner

TEST METHODS, TESTER, LOAD BOARD AND TEST SYSTEM

CROSS-REFERENCE TO RELATED APPLICATIONS

This application is a continuation application of International Patent Application No. PCT/CN2019/100510, filed on Aug. 14, 2019, which is based on and claims priority to and benefits of Chinese Patent Applications No. 201811012537.4 and No. 201821427929.2, both filed with the State Intellectual Property Office (SIPO) of the People's Republic of China on Aug. 31, 2018. The entire contents of the above-identified applications are incorporated herein by reference.

TECHNICAL FIELD

The present invention relates to the technical field of semiconductor testing and, in particular, to semiconductor test methods, testers, load boards and test systems.

BACKGROUND

In the state of the art, various chips, such as DRAM (Dynamic Random Access Memory), require extremely high performance. In order to avoid errors during use, chips are tested extensively before delivery from the factory.

Existing testers have limited number of test ports. Therefore, accelerating chip testing to increase production requires more testers, which will increase the manufacturing cost.

It is to be noted that the information in this Background section is provided only for the purpose of having a better understanding of the background of the present invention, and therefore does not necessarily constitute prior art already known to a person having ordinary skills in the art.

SUMMARY OF THE INVENTION

In one aspect, an embodiment of the present invention provides a test method, comprising: outputting, through a first input/output (I/O) port of a tester, a first test signal to a first channel of a load board, wherein the first test signal is configured to generate a second test signal and a third test signal; receiving, through the first I/O port, a third feedback signal returned from the first channel, wherein the third feedback signal is generated based on a first feedback signal and a second feedback signal; determining whether a first chip and a second chip are operating normally based on the third feedback signal.

In the exemplary embodiment of the present invention, the first feedback signal may be generated by the first chip in response to the second test signal, while the second feedback signal is generated by the second chip in response to the third test signal.

In the exemplary embodiment of the present invention, determining whether the first chip and the second chip are operating normally based on the third feedback signal comprises: if the third feedback signal is lower than a first threshold or higher than a second threshold, determining that the first chip and the second chip is operating normally; and if the third feedback signal is higher than or equal to the first threshold and lower than or equal to the second threshold, determining that the first chip or second chip is operating abnormally.

In the exemplary embodiment of the present invention, determining whether the first chip and the second chip are operating normally based on the third feedback signal comprises: acquiring a fourth feedback signal based on the third feedback signal; if the fourth feedback signal is lower than a third threshold or higher than a fourth threshold, determining that the first chip and second chip is operating normally; and if the fourth feedback signal is higher than or equal to the third threshold and lower than or equal to the fourth threshold, determining that the first chip or second chip is operating abnormally.

In another aspect, an embodiment of the present invention provides a test method, comprising: receiving, through a first channel of a load board, a first test signal provided by a first I/O port of a tester; generating a second test signal and a third test signal based on the first test signal; transmitting, through a second channel and a third channel of the load board, the second test signal to a first chip, and the third test signal to a second chip, respectively; receiving a first feedback signal and a second feedback signal through the second channel and the third channel, respectively, wherein the first feedback signal is generated by the first chip in response to the second test signal, and the second feedback signal is generated by the second chip in response to the third test signal; generating a third feedback signal based on the first feedback signal and the second feedback signal; and transmitting, through the first channel, the third feedback signal to the first I/O port, wherein the third feedback signal serves as a basis for determining whether the first chip and the second chip are operating normally.

In the exemplary embodiment of the present invention, each of the first chip and the second chip may be positioned in a socket, wherein the first chip is electrically connected to a first pin of the socket, and the second chip is electrically connected to a second pin of the socket.

In the exemplary embodiment of the present invention, the second signal and the third test signal may have a same frequency and a same phase.

In the exemplary embodiment of the present invention, the second test signal and the third test signal may have a same frequency, a same amplitude and a same phase.

In the exemplary embodiment of the present invention, generating the second test signal and the third test signal based on the first test signal comprises: duplicating the first test signal to generate the second test signal and the third test signal, respectively.

In the exemplary embodiment of the present invention, generating a third feedback signal based on the first feedback signal and the second feedback signal comprises: combining the first feedback signal with the second feedback signal to obtain the third feedback signal.

In the exemplary embodiment of the present invention, generating a third feedback signal based on the first feedback signal and the second feedback signal comprises: averaging the first feedback signal and the second feedback signal to obtain the third feedback signal.

In the exemplary embodiment of the present invention, the first pin and the second pin may have the same function.

In a third aspect, an embodiment of the present invention provides a tester, comprising: a first I/O port, configured to output a first test signal and receive a third feedback signal, wherein the first test signal is configured to generate a second test signal and a third test signal, and the third feedback signal is generated based on a first feedback signal and a second feedback signal; and a logic circuit, configured to determine, based on the third feedback signal, whether a first chip and a second chip are operating normally.

In a fourth aspect, an embodiment of the present invention provides a load board, comprising: a first channel, configured to receive a first test signal and send a third feedback signal; a second channel, configured to send a second test signal and receive a first feedback signal; a third channel, configured to send a third test signal and receive a second feedback signal; and a first signal processing circuit, electrically connected to each of the first channel, the second channel and the third channel, and configured to generate the second test signal and the third test signal based on the first test signal, and generate the third feedback signal based on the first feedback signal and the second feedback signal.

In a fifth aspect, an embodiment of the present invention provides a test system, comprising: the tester as identified above; the load board as identified above; and a socket, each of the socket and the tester electrically connected to the load board.

In the exemplary embodiment of the present invention, the socket may be configured to accommodate a chip, and wherein a pin of the chip is electrically connected to a pin of the socket.

In test methods, testers, load boards, and test systems provided in some embodiments of the present invention, a first test signal provided by a single I/O port of the tester is duplicated by the load board into a second test signal provided to a first chip, and a third test signal provided to a second chip, respectively. In response, the first chip generates a first feedback signal, and the second chip generates a second feedback signal, respectively. The load board generates a third feedback signal based on the first feedback signal and the second feedback, and transmits the third feedback signal to the same I/O port of the tester. The third feedback signal serves as a basis to determine whether the first chip and the second chip are operating normally. Thus, each I/O port of the tester can be multiplexed to increase the number of chips that can be tested at a single time. This can lead to an increase in chip production, as well as a reduction in the chip manufacturing cost.

BRIEF DESCRIPTION OF THE DRAWINGS

Various objects, features, and advantages of the present invention will become more apparent when taking into account the following detailed description of preferred embodiments of the present invention in conjunction with the accompanying drawings. These figures are presented merely to illustrate and exemplify the present invention and may not be drawn to scale. And same or similar reference numerals may indicate the same or analogous components throughout the figures, wherein.

DETAILED DESCRIPTION

Exemplary embodiments that demonstrate the features and advantages of the present invention will be described in detail below. It is to be understood that the embodiments of the present invention may be modified in various manners without departing from the scope of the invention. The description and drawings are illustrative in nature and do not limit the present invention in any way.

Various exemplary embodiments of the present invention will be described in reference to accompanying drawings, which constitute a part of the present invention and show examples of various exemplary structures, systems and steps to implement various aspects of the present invention. It is to be understood that structural and functional modifications can be made, without departing from the scope of the present invention, by using other specific schemes of components, structures, exemplary devices, systems, and steps.

Figure 1:
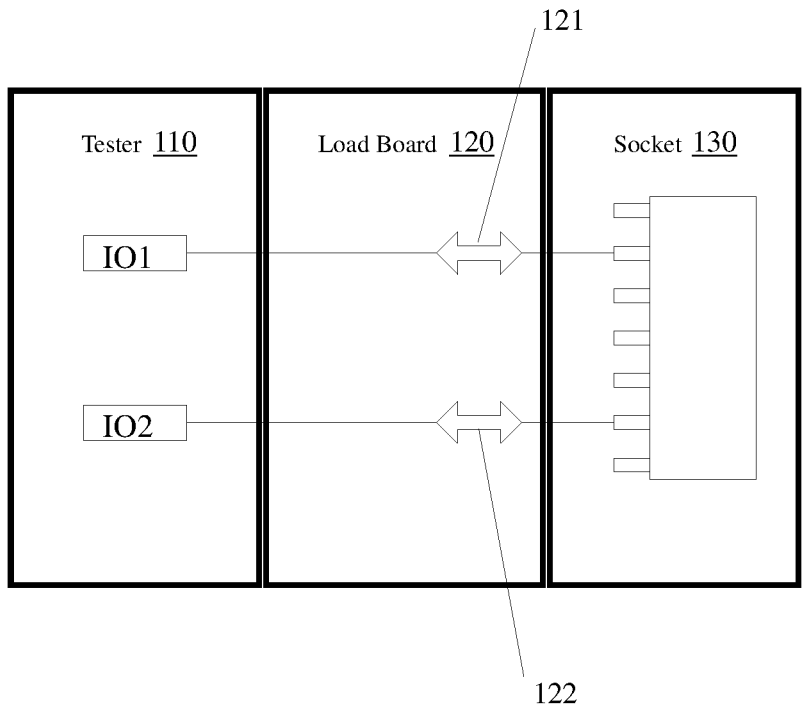
FIG. 1 is a structural schematic diagram of a test system in prior art.

FIG. 1 is a structural schematic diagram of a test system in prior art.

As shown in the embodiment of FIG. 1, the test system in prior art may include a tester 110, a load board 120 and a socket 130.

It is assumed that the tester 110 has two input/output (I/O) ports, indicated respectively as IO1 and IO2 in FIG. 1, and the chips are positioned in a socket 130 with their pins electrically connected to corresponding pins of the socket. Thus, the chips can receive test signals provided by the tester 110 via the pins of the socket 130. It is also assumed that each chip (not shown in the figure) has one pin. Therefore, as shown in FIG. 1, in order to test two chips at a single time, the tester 110 needs two I/O ports. Otherwise, a tester 110 with only one I/O port can only test a single chip at each time.

It is to be noted that the aforementioned exemplary numbers of I/O ports in the tester and pins in the chips may not be consistent with actual test conditions. Rather, such numbers can be determined based on actual needs.

Figure 2:
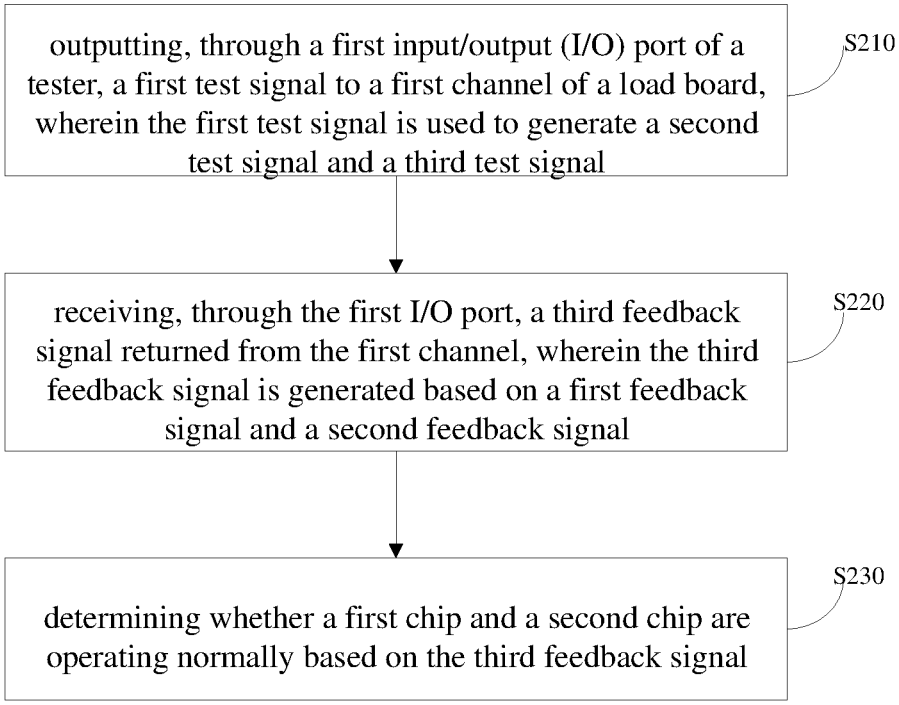
FIG. 2 is a flowchart of a test method according to an embodiment of the present invention.

FIG. 2 is a flowchart of a test method according to an embodiment of the present invention.

As shown in the embodiment of FIG. 2, the test method according to this embodiment may include the following steps.

In step S210, outputting, through a first I/O port of a tester, a first test signal to a first channel of a load board, wherein the first test signal is configured to generate a second test signal and a third test signal.

In the exemplary embodiment, the second and third test signals may be duplicates of the first test signal. It is to be noted that, as used herein, the term "duplicates" means that the second test signal and the third test signal has a same frequency, a same amplitude and a same phase, but the present invention is not limited thereto.

In step S220, receiving, through the first I/O port, a third feedback signal returned from the first channel, wherein the third feedback signal is generated based on a first feedback signal and a second feedback signal.

In the exemplary embodiment, the first feedback signal may be generated by a first chip in response to the second test signal, and the second feedback signal may be generated by a second chip in response to the third test signal.

In the exemplary embodiment, the third feedback signal may be generated by combining the first feedback signal with the second feedback signal, but the present invention is not limited thereto. For example, in other embodiments, the third feedback signal may also be generated by averaging the first feedback signal and the second feedback signal.

In step S230, determining whether the first chip and the second chip are operating normally based on the third feedback signal.

In the exemplary embodiment, the first chip and the second chip may be same, or a first pin of the first chip has the same function as a second pin of the second chip. In the latter case, after inputting the identical second test signal and the third test signal into the first pin and the second pin, respectively, the first feedback signal generated by the first chip is normally identical to the second feedback signal generated by the second chip. For example, at one time, if the first feedback signal is at a high level VH, then the second feedback signal is at a high level VH as well; or if the first feedback signal is at a low level VL, then the second feedback signal is at a low level VL as well. If any of the first chip and the second chip is operating abnormally, there will be a difference between the level of the first feedback signal and the second feedback signal at a particular time. For example, the first feedback signal is at the high level VH, while the second feedback signal is at the low level VL; or, the first feedback signal is at the low level VL, while the second feedback signal is at the high level VH.

Figure 3:
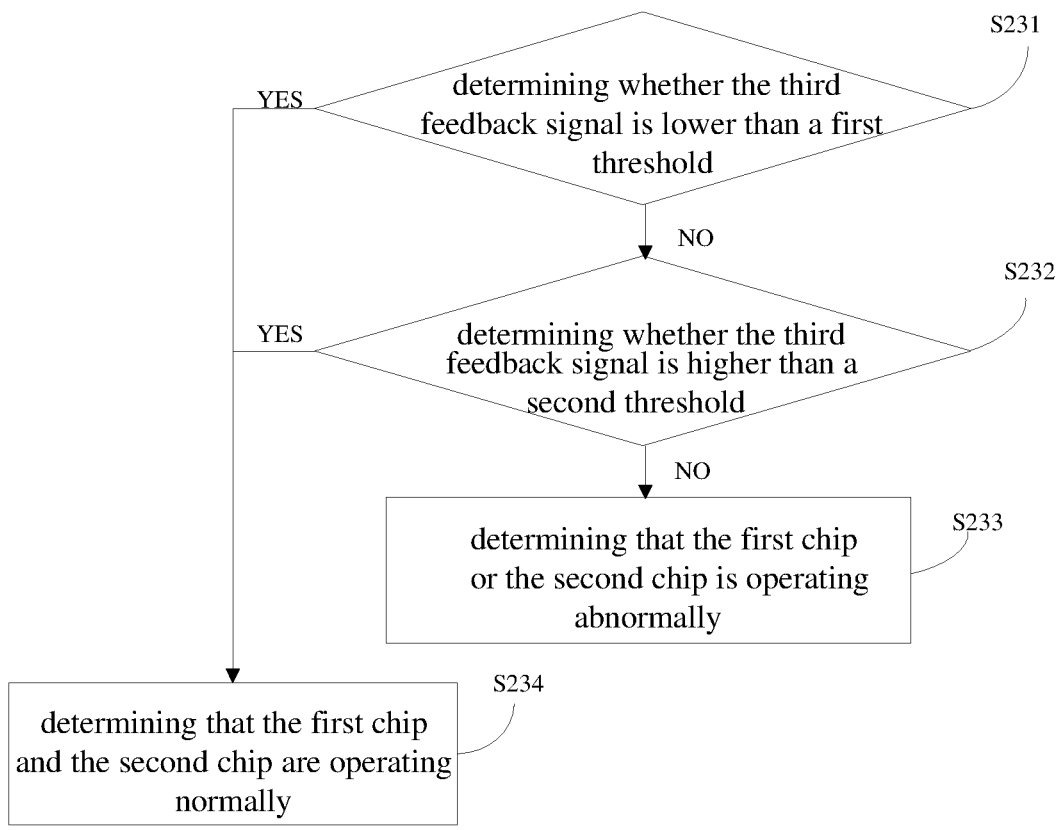
FIG. 3 is a flowchart of an exemplary embodiment in step S230 in the test method of FIG. 2.

FIG. 3 is a flowchart of an exemplary embodiment in step S230 in the test method of FIG. 2.

As shown in the embodiment of FIG. 3, in this embodiment, step S230 may include the following steps.

In step S231, determining whether the third feedback signal is lower than a first threshold. If the third feedback signal is lower than the first threshold, then the process will proceed to step S234. Otherwise, if the third feedback signal is higher than or equal to the first threshold, then the process will proceed to step S232.

In step S232, determining whether the third feedback signal is higher than a second threshold. If the third feedback signal is higher than the second threshold, then the process will proceed to step S234. Otherwise, if the third feedback signal is lower than or equal to the second threshold, then the process will proceed to step S233.

In step S233, determining that the first chip or the second chip is operating abnormally.

According to this embodiment, if the third feedback signal is higher than or equal to the first threshold and lower than or equal to the second threshold, then it can be determined that the first chip or the second chip is operating abnormally.

In step S234, determining that the first chip and the second chip are operating normally.

According to this embodiment, if the third feedback signal is lower than the first threshold or higher than the second threshold, then it can be determined that the first chip and the second chip is operating normally.

For example, when the chips are operating normally, at one time, if the first feedback signal is at a high level VH, then the second feedback signal is at a high level VH as well; or if the first feedback signal is at a low level VL, then the second feedback signal is at a low level VL as well.

In the case where the third feedback signal is obtained by combining the first feedback signal and the second feedback signal, i.e., Third Feedback Signal=(First Feedback Signal+Second Feedback Signal), the level of the third feedback signal is either 2VH or 2VL. If any of the first chip and the second chip goes abnormal, then the first feedback signal is at the high level VH, while the second feedback signal is at the low level VL; or the first feedback signal is at the low level VL, while the second feedback signal is at the high level VH. And the level of the third feedback signal will be (VH+VL). Since VH is generally higher than VL, 2VL is lower than (VH+VL), and (VH+VL) is lower than 2VH. Therefore, the first threshold may be set to a value that is higher than 2VL and lower than or equal to (VH+VL), and the second threshold to a value that is higher than or equal to (VH+VL) and lower than 2VH.

In the case where the third feedback signal is obtained by averaging the first feedback signal and the second feedback signal, i.e., Third Feedback Signal=(First Feedback Signal+Second Feedback Signal)/2, the level of the third feedback signal is equal to VH or VL. If any of the first chip and the second chip goes abnormal, then the first feedback signal is at the high level VH, while the second feedback signal is at the low level VL; or the first feedback signal is at the low level VL, while the second feedback signal is at the high level VH. And the level of the third feedback signal will be (VH+VL)/2. Since VH is generally higher than VL, VL is lower than (VH+VL)/2, and (VH+VL)/2 is lower than VH. Therefore, the first threshold may be set to a value that is higher than VL and lower than or equal to (VH+VL)/2, and the second threshold to a value that is higher than or equal to (VH+VL)/2 and lower than VH.

It is to be noted that the specific values of VH and VL may be determined based on the requirements of actual applications, and the present invention is not limited in this regard.

Figure 4:
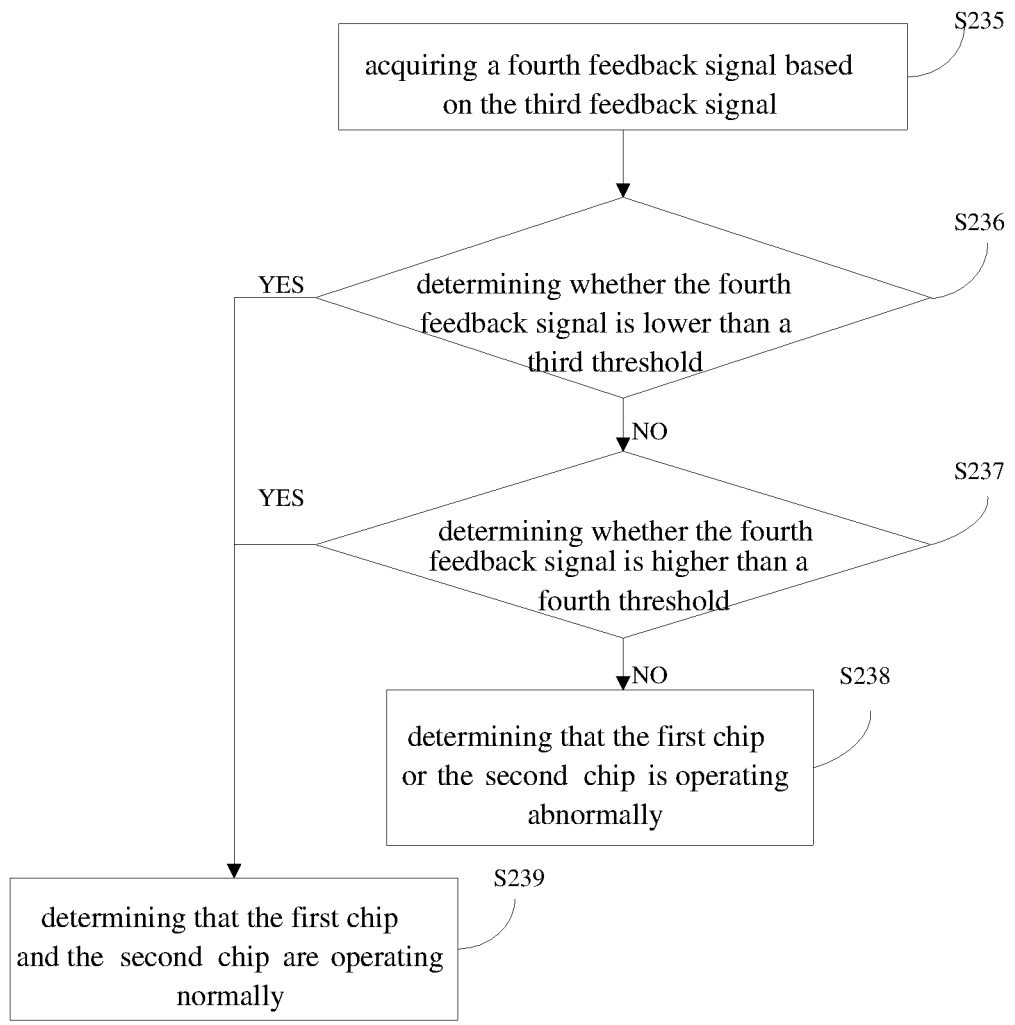
FIG. 4 is a flowchart of another exemplary embodiment in step S230 in the test method of FIG. 2.

FIG. 4 is a flowchart of another exemplary embodiment in step S230 in the test method of FIG. 2.

As shown in the embodiment of FIG. 4, in this embodiment, step S230 may include the following steps.

In step S235, acquiring a fourth feedback signal based on the third feedback signal.

In embodiments of the present invention, the third feedback signal may be obtained by combining the first feedback signal and the second feedback signal. In this case, after the third feedback signal is received at the first I/O port, the tester may further process it by, for example, dividing it by two, to acquire the fourth feedback signal, but the present invention is not limited thereto.

In step S236, determining whether the fourth feedback signal is lower than a third threshold. If the fourth feedback signal is lower than the third threshold, then the process will proceed to step S239. Otherwise, if the fourth feedback signal is higher than or equal to the third threshold, then the process will proceed to step S237.

In step S237, determining whether the fourth feedback signal is higher than a fourth threshold. If the fourth feedback signal is higher than the fourth threshold, then the process will proceed to step S239. Otherwise, if the fourth feedback signal is lower than or equal to the fourth threshold, then the process will proceed to step S238.

In step S238, determining that the first chip or the second chip is operating abnormally.

According to this embodiment, if the fourth feedback signal is higher than or equal to the third threshold and lower than or equal to the fourth threshold, then it can be determined that the first chip or the second chip is operating abnormally.

In step S239, determining that the first chip and the second chip are operating normally.

According to this embodiment, if the fourth feedback signal is lower than the third threshold or higher than the fourth threshold, then it is determined that the first chip and the second chip is operating normally.

For example, when the chips are operating normally, at one time, if the first feedback signal is at a high level VH, then the second feedback signal is at a high level VH as well; or if the first feedback signal is at a low level VL, then the second feedback signal is at a low level VL as well.

In the case where the third feedback signal is obtained by combining the first feedback signal and the second feedback signal, i.e., Third Feedback Signal=(First Feedback Signal+ Second Feedback Signal), the level of the fourth feedback signal is equal to VH or VL. If any of the first chip and the second chip goes abnormal, then the first feedback signal is at the high level VH, while the second feedback signal is at the low level VL; or the first feedback signal is at the low level VL, while the second feedback signal is at the high level VH. And the level of the fourth feedback signal will be (VH+VL)/2. Since VH is generally higher than VL, VL is lower than (VH+VL)/2, and (VH+VL)/2 is lower than VH. Therefore, the third threshold may be set to a value that is higher than VL and lower than or equal to (VH+VL)/2, and the fourth threshold to a value that is higher than or equal to (VH+VL)/2 and lower than VH.

Figure 5:
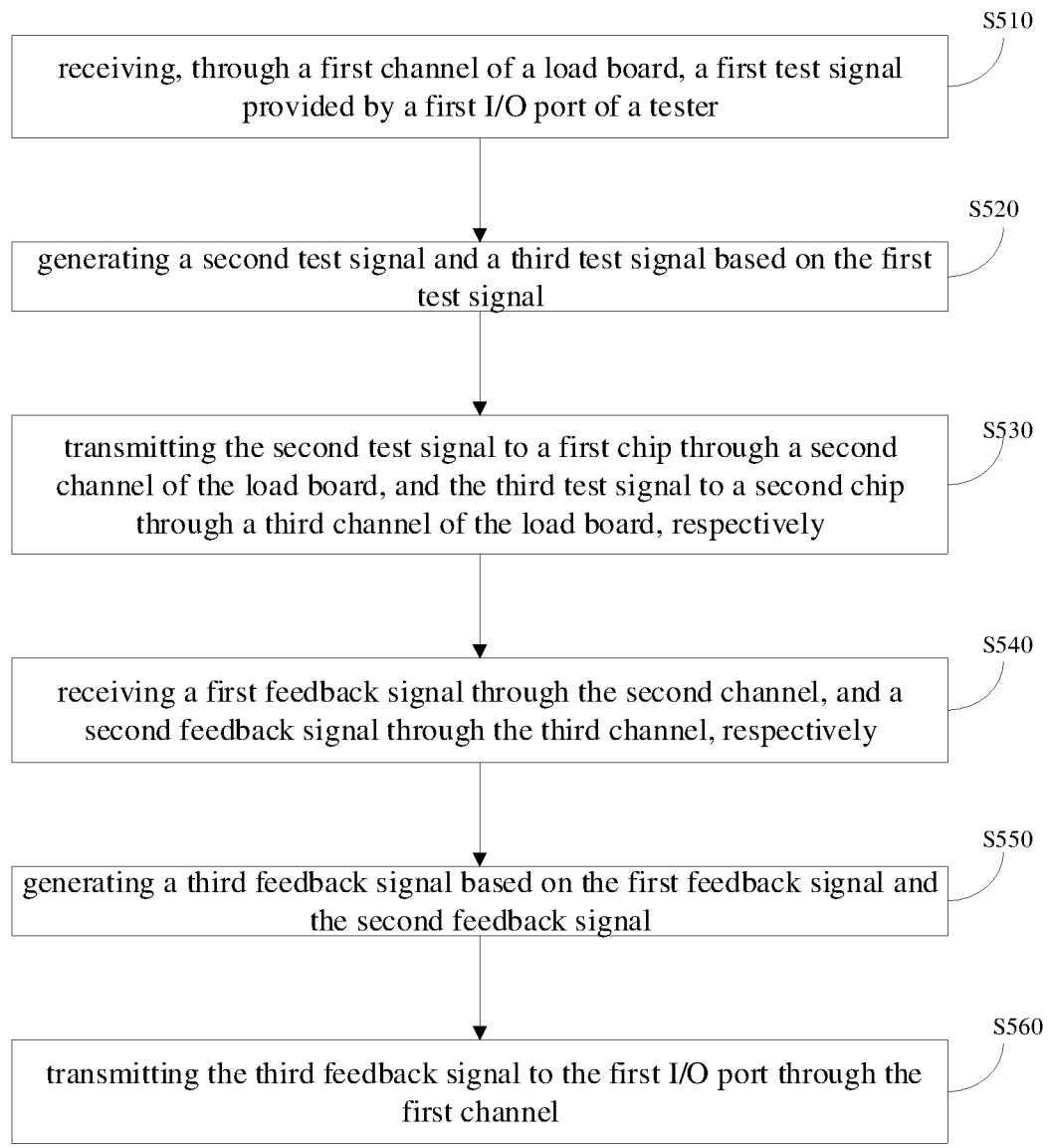
FIG. 5 is a flowchart of another test method according to an embodiment of the present invention.

FIG. 5 is a flowchart of another test method according to an embodiment of the present invention.

As shown in the embodiment of FIG. 5, the test method according to this embodiment may include the following steps.

In step S510, receiving, through a first channel of a load board, a first test signal provided by a first I/O port of a tester.

In step S520, generating a second test signal and a third test signal based on the first test signal.

In the exemplary embodiment, the second test signal and the third test signal may have a same frequency and a same phase.

In the exemplary embodiment, the second test signal and the third test signal may have a same frequency, a same amplitude and a same phase.

In the exemplary embodiment, the generation of the second test signal and the third test signal based on the first test signal may include duplicating the first test signal to generate the second test signal and the third test signal.

In step S530, transmitting the second test signal to a first chip through a second channel of the load board, and the third test signal to a second chip through a third channel of the load board, respectively.

In the exemplary embodiment, each of the first chip and the second chip is positioned in a socket, wherein the first chip is electrically connected to a first pin of the socket, and the second chip is electrically connected to a second pin of the socket.

In the exemplary embodiment, the first pin and the second pin may have the same function.

In step S540, receiving a first feedback signal through the second channel and a second feedback signal through the third channel, respectively. The first feedback signal may be generated by the first chip in response to the second test signal, and the second feedback signal may be generated by the second chip in response to the third test signal.

In step S550, generating a third feedback signal based on the first feedback signal and the second feedback signal.

In the exemplary embodiment, the generation of the third feedback signal based on the first feedback signal and the second feedback signal may include combining the first feedback signal and the second feedback signal to generate the third feedback signal.

In the exemplary embodiment, the generation of the third feedback signal based on the first feedback signal and the second feedback signal may include obtaining the third feedback signal by averaging the first feedback signal and the second feedback signal.

In step S560, transmitting the third feedback signal to the first I/O port through the first channel, wherein the third feedback signal serves as a basis for determining whether the first chip and the second chip are operating normally.

Figure 6:
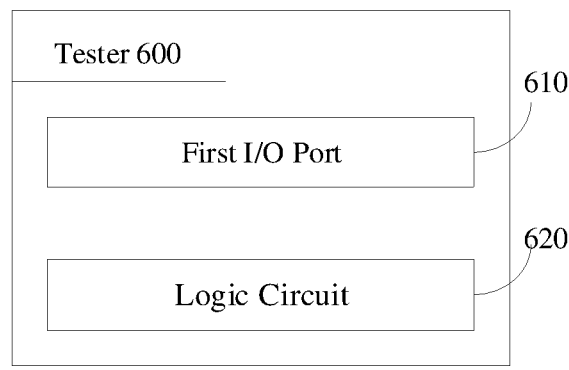
FIG. 6 is a block diagram of a tester according to an embodiment of the present invention.

FIG. 6 is a block diagram of a tester according to an embodiment of the present invention.

As shown in the embodiment of FIG. 6, the tester 600 according to this embodiment may include a first I/O port 610 and a logic circuit 620.

The first I/O port 610 may be configured to output a first test signal and receive a third feedback signal.

The first test signal may be configured to generate a second test signal and a third test signal, and the third feedback signal may be generated based on a first feedback signal and a second feedback signal.

The first feedback signal may be generated by a first chip in response to the second test signal, and the second feedback signal may be generated by a second chip in response to the third test signal.

The logic circuit 620 may be configured to determine, based on the third feedback signal, whether the first chip and the second chip are operating normally.

Reference can be made to the above embodiments for specific implementations of the various components of the tester according to this embodiment, and a duplicate detailed description thereof will be omitted here.

Figure 7:
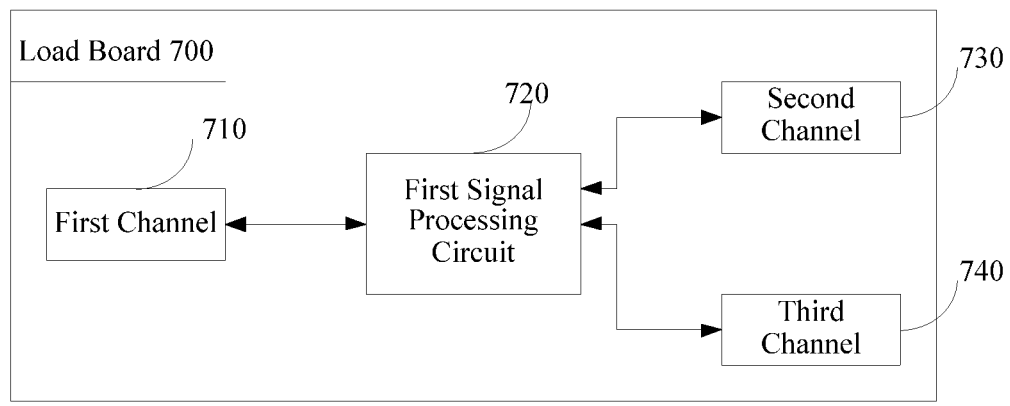
FIG. 7 is a block diagram of a load board according to an embodiment of the present invention.

FIG. 7 is a block diagram of a load board according to an embodiment of the present invention.

As shown in the embodiment of FIG. 7, the load board 700 according to this embodiment may include a first channel 710, a first signal processing circuit 720, a second channel 730, and a third channel 740.

Each of the first channel 710, the second channel 730, and the third channel 740 is electrically connected to the first signal processing circuit 720 to enable a bidirectional communication therebetween.

The first channel 710 may be configured to receive a first test signal and send a third feedback signal.

The second channel 730 may be configured to send a second test signal and receive a first feedback signal.

The third channel 740 may be configured to send a third test signal and receive a second feedback signal.

The first signal processing circuit 720 may be configured to generate the second test signal and the third test signal based on the first test signal, and generate the third feedback signal based on the first feedback signal and the second feedback signal.

The first feedback signal may be generated by a first chip in response to the second test signal, and the second feedback signal may be generated by a second chip in response to the third test signal.

Reference can be made to the above embodiments for specific implementations of the various components of the load board according to this embodiment, and a duplicate detailed description thereof will be omitted here.

Figure 8:
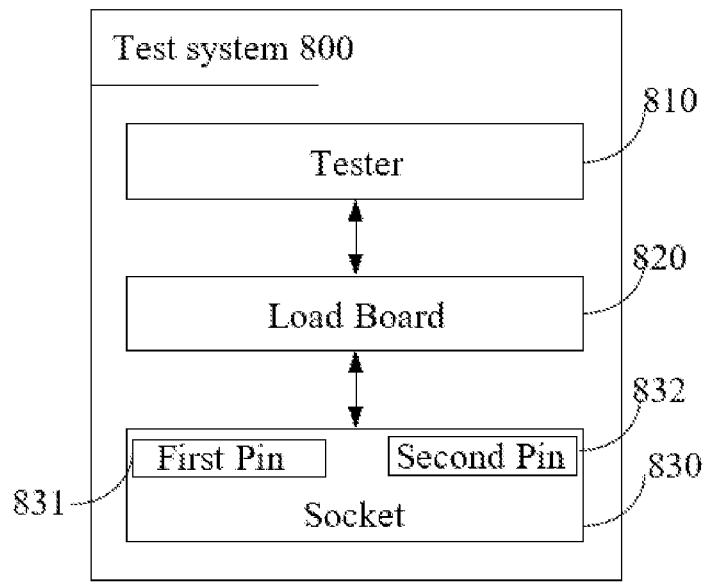
FIG. 8 is a block diagram of a test system according to an embodiment of the present invention.

FIG. 8 is a block diagram of a test system according to an embodiment of the present invention.

As shown in the embodiment of FIG. 8, the test system 800 according to this embodiment may include a tester 810, a load board 820 and a socket 830.

Each of the tester 810 and the socket 830 is electrically connected to the load board 820 to enable a bidirectional communication therebetween.

The socket 830 may include a first pin 831 and a second pin 832.

In the exemplary embodiment, the socket 830 may be configured to accommodate chips in such a manner that pins of the chips are electrically connected to the pins of the socket 830.

In the embodiment shown in FIG. 8, the chips include, for example, a first chip and a second chip. Each of the first chip and the second chip may be positioned in the socket 830. The first chip is electrically connected to the first pin 831 of the socket 830, and the second chip is electrically connected to the second pin 832 of the socket 830.

It is to be noted that this embodiment of the present invention gives exemplary socket having only two pins. In practice, the number of pins of the socket is not so limited, because more pins may be included.

Reference can be made to the above embodiments for specific implementations of the various components of the test system according to this embodiment, and a duplicate detailed description thereof will be omitted here.

Figure 9:
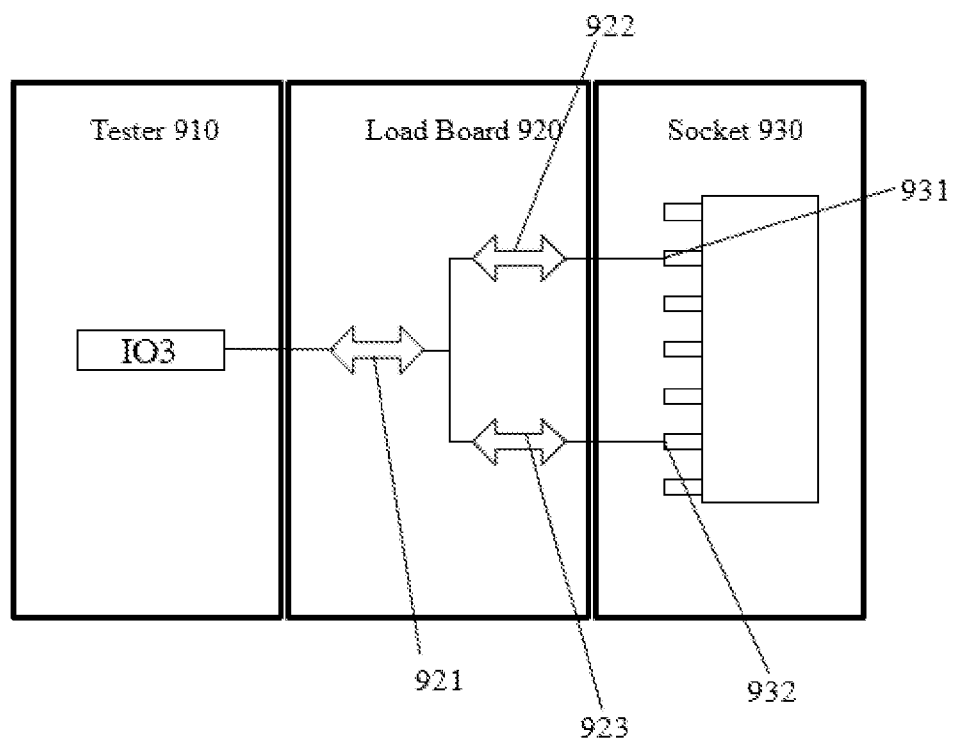
FIG. 9 is a structural schematic diagram of a test system according to an embodiment of the present invention.

FIG. 9 is a structural schematic diagram of a test system according to an embodiment of the present invention.

As shown in the embodiment of FIG. 9, the test system according to this embodiment may include a tester 910, a load board 920 and a socket 930.

The tester 910 may include a first I/O port IO3.

The load board 920 may include a first channel 921, a second channel 922 and a third channel 923.

The socket 930 may include a first pin 931 and a second pin 932.

It is assumed that a first chip and a second chip is both positioned within the socket 930, and a pin of the first chip is electrically connected to a first pin 931 of the socket 930, and a pin of the second chip is electrically connected to a second pin 932 of the socket 930. According to this embodiment, the first pin 931 and the second pins 932 may has the same function.

According to this embodiment, the first I/O port IO3 is configured to output a first test signal and transmit it through the first channel 921 to the load board 920, and the first test signal is duplicated into a second test signal and a third test signal. The second test signal is then delivered to the first pin 931 of the socket 930 through the second channel 922, and the third test signal is then delivered to the second pin 932 of the socket 930 through the third channel 923, respectively.

According to this embodiment, the first chip may generate a first feedback signal in response to the second test signal, and the second chip may generate a second feedback signal in response to the third test signal. The first feedback signal may be then transmitted to the second channel 922 of the load board 920 through the first pin 931, and the second feedback signal may be then transmitted to the third channel 923 of the load board 920 through the second pin 932, respectively. Subsequently, the first feedback signal and the second feedback signal may be combined or averaged to generate a third feedback signal which is then provided through the first channel 921 to the first I/O port IO3 of the tester 910. Accordingly, the third feedback signal may be used to determine whether the first chip and the second chip can pass the test.

It is to be noted that FIG. 9 gives an example of the tester with one I/O port, the load board with the first channel, the second channel, and the third channel, and the socket with the first pin and the second pin. In actual application, the numbers of I/O ports of the tester, channels of the load board, and pins of the socket are not so limited. The tester may has more I/O ports other than the first I/O port, each of which may output a same test signal similar to the first test signal output from the first I/O port. Such test signal may be transmitted to the load board through a single input channel thereof, and then duplicated into a plurality of test signals through multiple (two or more) output channels of the load board. The duplicated test signals are transmitted to pins of respective chips. After that, feedback signals generated by the chips may be combined (or processed further; if a single input channel is duplicated into n output channels, then n is a positive integer that is equal to or greater than 2) by a corresponding number of multiple input channels (since the channels of the load board allow bidirectional communication, the input channels can be the same as the aforesaid output channels), and the combined feedback signal may be transmitted via a corresponding single output channel (since the channels of the load board allow bidirectional communication, the single output channel may be the same as the aforementioned single input channel) to the I/O port from which the initial test signal was output. Thus, the number of chips that can be tested simultaneously can be increased without adding extra testers, thus enhancing the chip production and lowering the chip manufacturing cost.

In this embodiment, while the pin 931 and the pin 932 of the socket can be respectively connected to a first chip and a second chip, they can also be connected to different set of pins of the same chip, particularly if the number of pins on the chip is more than the number of I/O ports of the tester. In such a situation, the system can be configured to test a chip that has larger number of pins.

Figure 10:
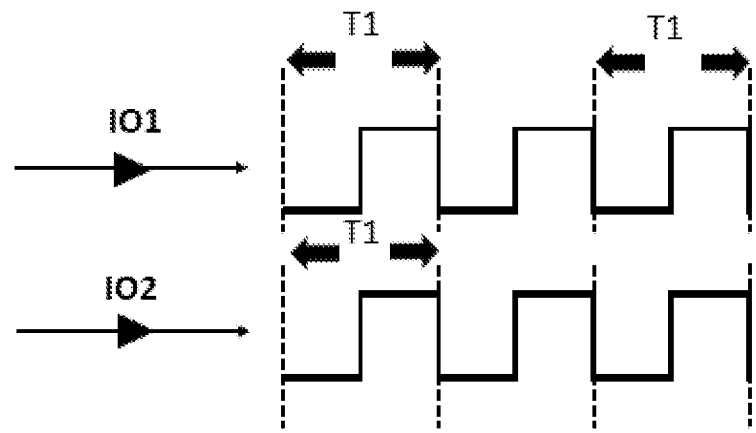
FIG. 10 is a timing diagram of test signals in the test system of FIG. 1.

FIG. 10 is a timing diagram of test signals in the test system of FIG. 1.

In the embodiment of FIG. 10, it is assumed that T1=10 ns. The first test signal from the I/O port IO1 of the tester 110 is transmitted to the first channel of the load board 120, and then to the first pin of the first chip in the socket 130; and the second test signal from the I/O port IO2 of the tester 110 is transmitted to the second channel of the load board 120, and then to the second pin of the second chip in the socket 130.

It is assumed that the pin of the first chip and the pin of the second chip has the same function. In addition, the first test signal from the I/O port IO1 and the second test signal from the I/O port IO2 of the tester 110 is identical, i.e., having the same frequency, same amplitude and same phase.

Figure 11:
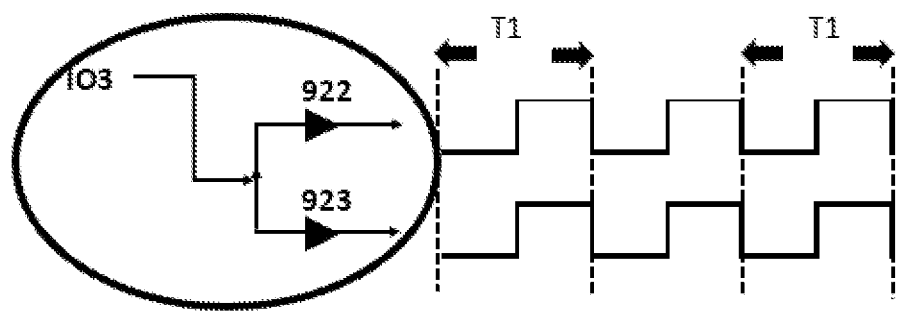
FIG. 11 is a timing diagram of test signals in the test system of FIG. 9.

FIG. 11 is a timing diagram of test signals in the test system of FIG. 9.

As shown in the embodiment of FIG. 11, the first test signal output by the first I/O port IO3 of the tester 910 is received by the first channel 921 of the load board 920, and then duplicated into the second test signal and the third test signal. The second test signal is output, through the second channel 922, to the first pin 931 of the socket 930, and the third test signal is output, through the third channel 923, to the second pin 932 of the socket 930.

It is assumed that the second test signal and the third test signal is both duplicated from the first test signal, therefore, the first test signal, the second signal, and the third test signal may be identical, i.e., having the same frequency, the same amplitude and the same phase.

Figure 12:
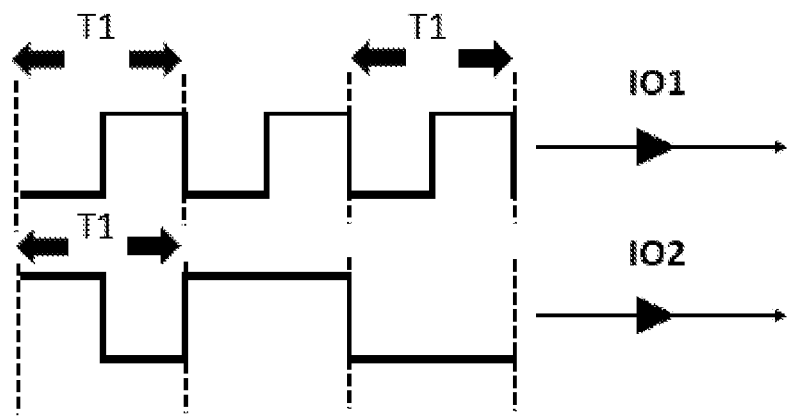
FIG. 12 is a timing diagram of feedback signals in the test system of FIG. 1.

FIG. 12 is a timing diagram of feedback signals in the test system of FIG. 1.

As shown in the embodiment of FIG. 12, the first pin of the first chip in the socket 130 generates the first feedback signal in response to the second test signal, which is then returned to the first I/O port IO1 of the tester 110 through the first channel 121 of the load board 120. The second pin of the second chip in the socket 130 generates the second feedback signal in response to the third test signal, which is then returned to the second I/O port IO2 of the tester 110 through the second channel 122 of the load board 120. The tester 110 then determines whether the first pin of the first chip and the second pin of the second chip are operating normally based on the first feedback signal received from the I/O port IO1 and second feedback signal received from the I/O port IO2, respectively.

As can be seen from FIG. 12, the first feedback signal and the second feedback signal has different phases. Accordingly, it can be determined that the second pin of the second chip is defective and does not pass the test (FAIL), while the first pin of the first chip passes the test (PASS).

Figure 13:
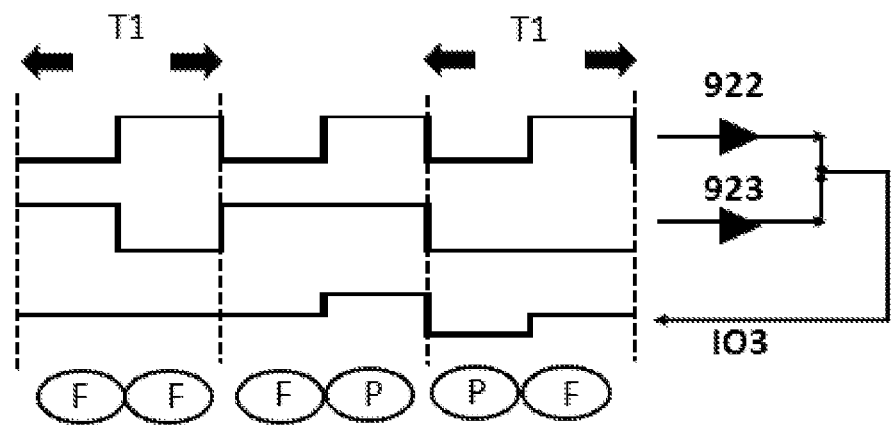
FIG. 13 is a timing diagram of feedback signals in the test system of FIG. 9.

FIG. 13 is a timing diagram of feedback signals in the test system of FIG. 9.

In the embodiment of FIG. 13, it is assumed that the load board 920 receives, via the second channel 922, the first feedback signal from the first pin 931 of the first chip in the socket 930, and receives, via the third channel 923, the second feedback signal from the second pin 932 of the second chip in the socket 930. The load board 920 further generates the third feedback signal by averaging the first feedback signal and the second feedback signal, and transmits it to the first I/O port IO3 of the tester 910 via the first channel 921. Based on the level of the third feedback signal, it can be determined whether the first pin of the first chip and the second pin of the second chip are operating normally.

For example, as shown in FIG. 13, it is assumed that VH=1.0 V, VL=0.2 V, and the third feedback signal is the average of the first feedback signal and the second feedback signal. If each chip passes the test, then the value of the third signal equals to either 1.0V((1.0+1.0)V/2) or 0.2V((0.2+0.2) V/2). If either chip fails the test, then the value of the third signal equals to 0.6V((1.0V+0.2V)/2). In the figure, "F" indicates "FAIL," and "P" indicates "PASS."

In test methods, testers, load boards, and test systems according to embodiments of the present invention, a first test signal provided by a single I/O port of the tester is duplicated by the load board into a second test signal which is then provided to a first chip, and a third test signal which is then provided to a second chip, respectively. In response, the first chip generates a first feedback signal, and the second chip generates a second feedback signal, respectively. A third feedback signal is generated by the load board based on the first feedback signal and the second feedback signal, and subsequently transmitted to the same I/O port of the tester to serve as a basis for determining whether the first chip and the second chip are operating normally. Thus, each I/O port of the tester can be multiplexed to increase the number of chips that can be tested at a single time. This can lead to an increase in chip production, as well as a reduction in the chip manufacturing cost.

Although exemplary embodiments of the test methods, the testers, the load boards, and the test systems proposed in this invention have been described and/or illustrated in detail above, embodiments of the present invention are not limited to these particular ones disclosed herein. Rather, components and/or steps of each embodiment may be used independently and separately from other components and/or steps described herein. And each component and/or step of a certain embodiment may be used in combination with other components and/or steps of other embodiments. When used to introduce an element/component/etc. described and/ or illustrated herein, the term "a," "an," "the" and the like is intended to mean there are one or more such elements/ components/etc. As used herein, the term "comprising," "including" and "having" is intended to be used in an open-ended sense to mean the possibility of other element(s)/component(s)/etc. apart from the listed element(s)/component(s)/etc. In the specification or the claims, the term "first," "second" and the like is merely used as reference signs, and shall not be construed as placing a quantitative limitation upon the amount of the mentioned items.

While the test methods, the tester, the load board, and the test system proposed in the present invention has been described in various particular embodiments, those skilled in the art will recognize that modifications to the embodiments are possible within the spirit and scope of the claims.

What is claimed is:

1. A test method, comprising:
   outputting, through a first input/output (I/O) port of a tester, a first test signal to a first channel of a load board, wherein the first test signal is used to generate a second test signal and a third test signal;
   receiving, through the first I/O port, a third feedback signal returned from the first channel, wherein the third feedback signal is generated based on a first feedback signal and a second feedback signal, the first feedback signal is generated by a first data source in response to the second test signal, and the second feedback signal is generated by a second data source in response to the third test signal; and
   determining whether the first data source and the second data source are operating normally based on the third feedback signal,
   wherein the determining whether the first data source and the second data source are operating normally based on the third feedback signal comprises:
   if the third feedback signal is lower than a first threshold or higher than a second threshold, determining that the first data source and the second data source are operating normally; and
   if the third feedback signal is higher than or equal to the first threshold and lower than or equal to the second threshold, determining that the first data source or the second data source is operating abnormally.

2. The test method of claim 1, wherein the first data source is connected to a first chip, and the second data source is connected to a second chip.

3. The test method of claim 1, wherein the first data source and the second data source are connected to different pins of a same chip.

4. The test method of claim 1, wherein the third feedback signal is generated by averaging the first feedback signal and the second feedback signal.

5. A test method, comprising:
   outputting, through a first input/output (I/O) port of a tester, a first test signal to a first channel of a load board, wherein the first test signal is used to generate a second test signal and a third test signal;
   receiving, through the first I/O port, a third feedback signal returned from the first channel, wherein the third feedback signal is generated based on a first feedback signal and a second feedback signal, the first feedback signal is generated by a first data source in response to the second test signal, and the second feedback signal is generated by a second data source in response to the third test signal; and determining whether the first data source and the second data source are operating normally based on the third feedback signal, wherein the determining whether the first data source and the second data source are operating normally based on the third feedback signal comprises:

acquiring a fourth feedback signal based on the third feedback signal;

if the fourth feedback signal is lower than a third threshold or higher than a fourth threshold, determining that the first data source and the second data source are operating normally; and if the fourth feedback signal is higher than or equal to the third threshold and lower than or equal to the fourth threshold, determining that the first data source or the second data source is operating abnormally.

6. The test method of claim 5, wherein the third feedback signal is generated by averaging the first feedback signal and the second feedback signal.

7. The test method of claim 5, wherein the first data source is connected to a first chip, and the second data source is connected to a second chip.

8. The test method of claim 5, wherein the first data source and the second data source are connected to different pins of a same chip.

9. A test method, comprising:

receiving, through a first channel of a load board, a first test signal provided by a first input/output (I/O) port of a tester;

generating a second test signal and a third test signal based on the first test signal;

transmitting, through a second channel and a third channel of the load board, the second test signal to a first data source, and the third test signal to a second data source, respectively;

receiving a first feedback signal and a second feedback signal through the second channel and the third channel, respectively, wherein the first feedback signal is generated by the first data source in response to the second test signal, and the second feedback signal is generated by the second data source in response to the third test signal;

generating a third feedback signal based on the first feedback signal and the second feedback signal; and transmitting, through the first channel, the third feedback signal to the first I/O port, wherein the third feedback signal serves as a basis for determining whether the first data source and the second data source are operating normally, wherein the generating a third feedback signal based on the first feedback signal and the second feedback signal comprises:

averaging the first feedback signal and the second feedback signal to obtain the third feedback signal.

10. The test method of claim 9, wherein each of the first data source and the second data source is positioned in a socket, and wherein the first data source is electrically connected to a first pin of the socket and the second data source is electrically connected to a second pin of the socket.

11. The test method of claim 10, wherein the first pin and the second pin have a same function.

12. The test method of claim 9, wherein the second test signal and the third test signal have a same frequency and a same phase.

13. The test method of claim 9, wherein the second test signal and the third test signal have a same frequency, a same amplitude and a same phase.

14. The test method of claim 9, wherein the generating a second test signal and a third test signal based on the first test signal comprises:

duplicating the first test signal to generate the second test signal and the third test signal, respectively.

15. The test method of claim 9, wherein the first data source is connected to a first chip, and the second data source is connected to a second chip.

16. The test method of claim 9, wherein the first data source and the second data source are connected to different pins of a same chip.

17. A test system, comprising a tester, a load board, and a socket, wherein the tester comprises:

a first input/output (I/O) port, configured to output a first test signal and receive a third feedback signal, wherein the first test signal is used to generate a second test signal and a third test signal, the third feedback signal is generated based on a first feedback signal and a second feedback signal, the first feedback signal is generated by a first data source in response to the second test signal, the second feedback signal is generated by a second data source in response to the third test signal; and a determination logical circuit, configured to determine, based on the third feedback signal, whether the first data source and the second data source are operating normally;

wherein the load board comprises:

a first channel, configured to receive the first test signal and send the third feedback signal;

a second channel, configured to send the second test signal and receive the first feedback signal;

a third channel, configured to send the third test signal and receive the second feedback signal; and a first signal processing circuit, electrically connected to each of the first channel, the second channel and the third channel, and configured to generate the second test signal and the third test signal based on the first test signal, and generate the third feedback signal based on the first feedback signal and the second feedback signal by averaging the first feedback signal and the second feedback signal; and wherein each of the socket and the tester is electrically connected to the load board.

18. The test system of claim 17, wherein the socket is configured to accommodate a data source, and wherein a pin of the data source is electrically connected to a pin of the socket.

19. The test system of claim 17, wherein the first data source is connected to a first chip, and the second data source is connected to a second chip.

20. The test system of claim 17, wherein the first data source and the second data source are connected to different pins of a same chip.

* * * * *